United States Patent [19]

Grossa

[11] Patent Number: 4,604,340

[45] Date of Patent: Aug. 5, 1986

[54] NEGATIVE-TONING IMAGING SYSTEM WITH RE-IMAGING CAPABILITY USING 4-(2'-NITROPHENYL)-1,4-DIHYDROPYRIDINE COMPOUNDS

[75] Inventor: Mario Grossa, Dreieich, Fed. Rep. of Germany

[73] Assignee: E. I. Du Pont de Nemours and Company, Wilmington, Del.

[21] Appl. No.: 757,841

[22] Filed: Jul. 22, 1985

[30] Foreign Application Priority Data

Aug. 11, 1984 [DE] Fed. Rep. of Germany ....... 3429615

[51] Int. Cl.[4] ................................................. G03C 1/72
[52] U.S. Cl. ...................................... 430/270; 430/291
[58] Field of Search ....................... 430/144, 270, 291

[56] References Cited

U.S. PATENT DOCUMENTS

| | | | |
|---|---|---|---|
| 3,901,710 | 8/1975 | Ranz et al. | 96/67 |
| 4,181,531 | 1/1980 | Pilz | 430/270 |
| 4,243,741 | 1/1981 | Abele et al. | 430/270 |
| 4,273,842 | 6/1981 | Nonogaki et al. | 430/25 |
| 4,346,162 | 8/1982 | Abele | 430/270 |

*Primary Examiner*—John D. Welsh

[57] ABSTRACT

A process for the production of patterns on a substrate bearing a layer of a negative-working, light-sensitive composition comprising at least one 1,4-dihydropyridine compound substituted in the 4 position by a 2'-nitrophenyl ring which becomes tacky and tonable on exposure to actinic radiation, comprising the steps of:

(a) exposing said light-sensitive layer imagewise to actinic radiation whereby tacky areas are formed, and, (b) toning said exposed tacky areas with finely divided powders.

8 Claims, No Drawings

NEGATIVE-TONING IMAGING SYSTEM WITH RE-IMAGING CAPABILITY USING 4-(2'-NITROPHENYL)-1,4-DIHYDROPYRIDINE COMPOUNDS

TECHNICAL FIELD

This invention relates to the field of photographic reproduction methods. More particularly, it relates to the production of patterns comprising powders on a substrate using a negative-working, light-sensitive layer containing as the photosensitive component a 4-(2'-nitrophenyl)-1,4-dihydropyridine compound which becomes tacky and tonable on exposure to light.

BACKGROUND ART

Photographic imaging systems that utilize differences in tackiness between exposed and unexposed areas of light-sensitive layers are known in the photographic reproduction area. Photohardening and phototackification are two alternate means of achieving the required tacky/nontacky differential between exposed and unexposed areas.

Reproduction systems utilizing photohardening are known from U.S. Pat. Nos. 3,060,024; 3,620,726; and 3,582,327, wherein a tacky photopolymerizable reproduction material is hardened by imagewise exposure so that the exposed image areas lose their tackiness. The image is then made visable by dusting on of suitable toners, which adhere only to the unexposed tacky areas, but do not adhere to and can be removed from the exposed, nontacky image areas. This process yields a positive image of the original.

Reproduction systems using phototackification are also known. For example, a negative tonable material which contains a combination of at least one dihydropyridine compound and at least one bisimidazole compound is known from U.S. Pat. No. 4,243,741. The image production is based on the known photochemical dissociation of bisimidazoles. The low molecular weight cleavage products formed thereby bring about an increase in the tackiness of the exposed areas, so that a toner will then adhere to the exposed areas. Another system based on the same principle is described in U.S. Pat. No. 4,346,162.

However, in order to obtain satisfactory reproduction quality with bisimidazole systems, it is necessary to prevent the recombination of the cleavage products. A recombination would lead to an impairment of sensitometric properties as well as an inability to achieve the desired coverage with toner powder on the exposed areas. Recombination can be prevented, however, by an internal or external plasticization of the layers which leads to a reduction of viscosity so that a minimum mobility of the cleavage products in the layer is assured. It is disadvantageous, however, that such layers have a tendency to form stain by deposition of toner in unexposed areas. Additionally, many plasticizers tend to diffuse or to evaporate from the layers, resulting in poor storage stability, variable sensitometric properties, and primarily varied or even insufficient densities of toner when different exposure and toning steps are carried out on the same light-sensitive layer.

Another negative tonable reproduction material is known from U.S. Pat. No. 4,273,842. The light-sensitive diazonium salts described therein form hygroscopic decomposition products on exposure to light. These decomposition products then become tacky by absorption of water. A uniform covering of the exposed areas with toners with this material is only attainable when exposure and toning are carried out in the presence of constant amounts of water. Therefore, expensive apparatus are required to establish and control the humidity in the room and the length of exposure to the air in the room.

In addition, the diazonium salts contained in the photosensitive layers must be in a crystalline state at least on the surface of the layer. Otherwise, the layers are tacky even before exposure. This leads to poor differentiation between exposed and unexposed areas, as well as fogging and the formation of spots. A further disadvantage which renders tacky starting materials useless for many applications is their sensitivity to dirt and dust before exposure.

An object of the present invention is, therefore, to find a process for the production of patterns comprising powders on a substrate using a negative-working tonable light-sensitive layer, which even upon multiple exposures achieves a high density and uniform coating of the exposed areas with toners. Other objects are to avoid changes in photographic sensitivity brought about by varying concentrations of plasticizer and to allow exposure and toning to be carried out under normal room conditions.

DISCLOSURE OF THE INVENTION

BRIEF SUMMARY OF THE INVENTION

In accordance with this invention there is provided a process for the production of patterns on a substrate bearing a layer of negative-working, light-sensitive composition comprising at least one 1,4-dihydropyridine compound substituted in the 4 position by a 2'-nitrophenyl ring which becomes tacky and tonable on exposure to actinic radiation, comprising the steps of:

(a) exposing said light-sensitive layer imagewise to actinic radiation whereby tacky areas are formed; and, (b) toning said exposed tacky areas with finely divided powders.

The exposing and toning steps may be repeated several times, as desired, using different images for exposure and different powders for toning.

Preferred are 1,4-dihydropyridine compounds of the following formula:

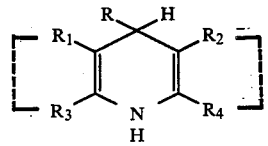

in which:

R is 2'-nitrophenyl, wherein the phenyl radical can be further substituted by alkyl or oxalkyl of 1 to 4 carbon atoms, —OH, halogen, —NH$_2$ groups;

R$_1$ and R$_2$, which can be the same or different, are —CN, —COOR', or —COR', wherein R' represents an alkyl group with 1-11 carbon atoms, which also can be substituted by —OCH$_3$ or —OC$_2$H$_5$;

R$_3$ and R$_4$, which can be the same or different, are alkyl of 1 to 4 carbon atoms;

R$_1$ and R$_3$ taken together may form a 5- and/or or 6-membered carbocyclic or R₂ and R₄ heterocyclic ring containing a carbonyl group.

The following dihydropyridine compounds have been shown to be especially suitable:

Dimethyl ester of 2,6-dimethyl-4-(2'-nitrophenyl)-1,4-dihydropyridine-3,5-dicarboxylic acid; diethyl ester of 2,6-dimethyl-4-(2'-nitrophenyl)-1,4-dihydropyridine-3,5-dicarboxylic acid; diethyl ester of 2,6-dimethyl-4-(2'-nitro-4',5'-dimethoxy phenyl)-1,4-dihydropyridine-3,5-dicarboxylic acid; di-n-propyl ester of 2,6-dimethyl-4-(2'-nitrophenyl)-1,4-dihydropyridine-3,5-dicarboxylic acid; diisopropyl ester of 2,6-dimethyl-4-(2'-nitrophenyl)-1,4-dihydropyridine-3,5-dicarboxylic acid; diisopropyl ester of 2,6-dimethyl-4-(2'-nitrophenyl)-1,4-dihydropyridine-3,5-dicarboxylic acid; di($\beta$-ethoxyethyl)ester of 2,6-dimethyl-4-(2'-nitrophenyl)-1,4-dihydropyridine-3,5-dicarboxylic acid; 3-methyl-5-ethyl ester of 2,6-dimethyl-4-(2'-nitrophenyl)-1,4-dihydropyridine-3,5-dicarboxylic acid; 3-isopropyl-5-methyl ester of 2,6-dimethyl-4-(2'-nitrophenyl)-1,4-dihydropyridine-3,5-dicarboxylic acid; ethyl ester of 4-(2'-nitrophenyl)-2,6-dimethyl-3-aceto-1,4-dihydropyridine-5-carboxylic acid; 2,6-dimethyl-4-(2'-nitrophenyl)-3,5-diaceto-1,4-dihydropyridine and 2,6-dimethyl-4-(2'-nitrophenyl)-3,5-dicyano-1,4-dihydropyridine.

The preparation of 1,4-dihydropyridine compounds can be carried out, e.g. according to the methods of the Hantzsch synthesis from one mole of an aliphatic or aromatic aldehyde, one mole ammonia, and 2 moles of a $\beta$-ketocarboxylic acid ester, a $\beta$-ketocarboxylic acid nitrile, or a $\beta$-diketone. In using $\beta$-aminocrotonic acid esters the addition of ammonia becomes unnecessary. For details see: Elderfield, Heterocyclic Compounds, Vol. 1, 1950, p. 462, as well as Gattermann/Wieland, Die Praxis des organischen Chemikers, 39th Edition, 1959, p. 312 ff., which are incorporated herein by reference.

The light-sensitive compounds can be applied onto the substrate alone or in mixture with each other or together with a binder using known methods. Although the preferred application is to use layers which consist exclusively of 1,4-dihydropyridine compounds, the light-sensitive substance can also be used together with binders. The proportion of the light-sensitive substance relative to the binder can vary within wide limits and lies in the range of 0.2 to 9 parts by weight relative to 1 part by weight of binder.

Suitable polymeric binders include: polyacrylic and/or polymethacrylic acid esters as well as copolymers of acrylic and/or methacrylic acids or other acrylic and/or vinyl monomers; copolymers of maleic acid anhydride, maleic acid, and/or its di- or semiesters with styrene, or other vinyl monomers; chlorine-containing vinyl polymers or copolymers, e.g., polyvinylchloride, as well as its after-chlorination products, polyvinylidene chloride, chlorinated polyethylene, etc.; polystyrene and styrene copolymers, polyethylene and ethylene copolymers with, e.g., maleic acid, etc.; synthetic rubbers based on butadiene, chloroprene, etc., and their copolymers with, e.g., styrene, acrylonitrile, etc.; polyethers, such as high molecular weight polyethylene oxides or polyepichlorohydrin.

The layers can optionally contain other additives as, e.g., sensitizers, stabilizers, optical brighteners, matting agents, surfactants, or others. Among others, benzophenone, Michler's ketone, or 7-diethylaminocoumarin have proven to be especially useful.

Especially good results with respect to attainable uniformity of the tonable density are obtained when the light-sensitive dihydropyridine compounds are used in the layer in a noncrystalline state. This can be achieved, e.g., by the use of mixtures of these compounds, by melting and rapid cooling of the compounds, or by using coating solutions of the compounds dissolved in highly volatile solvents with a high dissolving power. Suitable solvents are methyl ethyl ketone, acetone, or methylene chloride.

A large number of transparent or opaque materials are possible supports for the light-sensitive layer. These are, e.g., papers, optionally baryta coated; cardboard; metal foils, for example, aluminum, copper, steel, etc.; wood; glass; porcelain; ceramics; films or nonwovens of natural or synthetic polymers.

Additional layers, for example, adhesive layers, can be used on the support if necessary. A special protective film over the light-sensitive layer, which would have to be removed before toning, is basically unnecessary because the unexposed layer is nontacky. It can be applied, however, if desired, to prevent damage to the light-sensitive layer.

The process of the invention can be applied in numerous areas. Thus, it can be used for the production of single or multicolor images. It is, moreover, suited for carrying out color-proofing processes, for the production of printed circuits, electronic circuits, to produce images on ceramic articles, as well as for the production of viewing screens for cathode ray tubes.

The superior toning behavior, especially in case of multiple exposures, can be advantageously used for the production of viewing screens for color picture tubes. For this purpose a thin light-sensitive layer is applied to the inside of the screen by spin coating and is dried. This layer is then exposed through a shadow or perforated mask and the exposed tacky striped or circular image elements are toned with a light emitting phosphor powder in one of the colors blue, green, or red. By a second and third exposure other areas of the light-sensitive layer are likewise made tacky in the form of striped or circular image elements and are toned with the light emitting phosphor powders of the other colors. Subsequently, the light-sensitive layer is removed by heating at temperatures >400° C.

The light-sensitive materials used according to the invention have their maximum sensitivity in the ultraviolet range, preferably between 320 and 390 nm. Suitable sources of effective amounts of this radiation are, e.g., xenon lamps, mercury vapor lamps, and fluorescent lamps.

Toners composed of finely divided powders of various composition can be used for toning the exposed areas. Suitable are, e.g., inorganic or organic pigments, light emitting phosphor powders, metal powders, as well as soluble organic dyes in pure form or on a powdery organic or inorganic carrier. Examples are: titanium dioxide, $SiO_2$, glass powder, carbon (carbon black or graphite), Cu-phthalocyanines, azo dyes, metal powders comprising aluminum, copper, iron, gold, or silver or metal oxides. The toner can also contain additives such as wetting agents, antistatics, and others.

Toner can be applied onto the exposed layer either by hand, e.g., using a cotton pad, or using special application devices. Suitable methods are known to those skilled in the art.

Using the process of the invention high quality patterns comprising finely divided powders on a substrate can be produced, which, compared to the known state of the art, excel primarily by achieving a high density, uniform, and reproducible coating of the exposed image elements with toners.

It was surprising to those skilled in the art that nitrophenyl-1,4-dihydropyridine compounds could be used at all for the production of negative-working tonable layers. It was known, for example, that exposure of these compounds does not produce low molecular weight cleavage products or hygroscopic reaction products which would bring about the tackiness of the layer. Rather, water-soluble or hydrophilic nitroso compounds are formed which differ in their molecular weight only insignificantly from the unexposed product. Moreover, it was not expected that a high density, uniform, and reproducible toning of the exposed areas could be attained because the nitroso compounds formed during exposure have a strong tendency toward dimerization (J. A. Berson, Journal of the American Chemical Society 77, 1955, p. 442), so that, depending on the extent of dimerization, considerable variability in toning behavior was to be expected.

Although it is known from U.S. Pat. Nos. 3,901,710 and 4,181,531, that 2'-nitrophenyl- and the analogously functioning 5'-nitrofuryl-1,4 dihydropyridine compounds are suited for the production of positive-working washoff reliefs, it was surprising that only 2'-nitrophenyl-1,4-dihydropyridine compounds can be used for the production of negative-working tonable reproduction materials with superior toning properties, whereas the equivalent 5'-nitrofuryl-1,4-dihydropyridine compounds are unusable for such toning processes.

The following examples explain the invention:

EXAMPLE 1

7.5 g of dimethyl ester of 2,6-dimethyl-4-(2'-nitrophenyl)-1,4-dihydropyridine-3,5-dicarboxylic acid,
7.5 g of diethyl ester of 2,6-dimethyl-4-(2'-nitrophenyl)-1,4-dihydropyridine-3,5-dicarboxylic acid, and
2.0 g of poly-n-butylmethacrylate with a glass transition temperature ($T_g$) value of 15° C. are dissolved in 285 ml of methyl ethyl ketone and the solution is applied to a glass plate and dried. The thickness of the dried layer is 1.4 μm. The plate is then exposed behind a line original for 60 seconds using a mercury vapor lamp (1000 W) at a distance of 40 cm. Subsequently the exposed layer is toned with a blue pigment using a cotton pad and the nonadhering toner is removed. A blue negative image of the original is obtained.

EXAMPLE 2

A glass plate is coated by dipping in a solution of
6 g of diethyl ester of 2,6-dimethyl-4-(2'-nitro-4',5'-dimethoxyphenyl)-1,4-dihydropyridine-3,5-dicarboxylic acid
in 100 ml of methylene chloride and then is dried. The layer thickness after drying is 1.4 μm.

Then it is exposed through a line original using ultraviolet light (360 nm, 300 mJ/cm$^2$) and the glass plate is toned by suspending in an iron oxide pigment (average diameter 4 μm) and the excess pigment is removed by blowing.

Other areas of the layer are then analogously exposed behind a second line original and are toned with copper powder (average diameter 10 μm). Two imagewise patterns composed of the respective metal toners are obtained.

EXAMPLE 3

10 g of diisopropyl ester of 2,6-dimethyl-4-(2'-nitrophenyl)-1,4-dihydropyridine-3,5-dicarboxylic acid are dissolved in 200 ml of methyl ethyl ketone and are applied onto a ceramic substrate so that the thickness of the dried layer is 1 μm.

The coated substrate is then exposed through a line original using a mercury vapor lamp (360 nm, 350 mJ/cm$^2$). The exposed layer is then toned with a cotton pad with copper powder having an average particle diameter of 5 μm. Subsequently, other areas of the layer are exposed behind a second line original under the same conditions and the exposed areas are toned with silver powder. Two imagewise patterns composed of the respective metal toners are obtained.

EXAMPLE 4

A solution of
3.25 g of dimethyl ester of 2,6-dimethyl-4-(2'-nitrophenyl)-1,4-dihydropyridine-3,5-dicarboxylic acid and
3.25 g of diethyl ester of 2,6-dimethyl-4-(2'-nitrophenyl)-1,4-dihydropyridine-3,5-dicarboxylic acid
in 100 ml of methyl ethyl ketone is applied by centrifuging on the inside of a color TV screen. The thickness of the dried layer is 1.2 μm. The coated screen is then placed on a television exposure table used for this purpose and exposed for 40 seconds through a shadow mask having slit-shaped openings, utilizing a 1000 W mercury vapor lamp at a distance of 20 cm from the coating. After exposure of the lines for the first color it is toned with a green light emitting phosphor powder (average particle diameter 8 μm) whereby a pattern of green emitting lines is formed. The subsequent second exposure is carried out with an adjusted position of the lamp in relation to the screen, so that after toning with a blue emitting phosphor powder a second line pattern is formed parallel to the first. Similarly after a third exposure a red emitting phosphor powder is applied.

After blowing off the excess toner the screen appears filled with a uniform line pattern in the colors green, blue, and red.

The light-sensitive layer is then removed by heating to 410° C.

EXAMPLE 5

Two glass plates are coated by dipping one in solution A:
40 g of 1,4-dihydropyridine-2,6-dimethyl-3,5-dicarboxylic acid methyl ester
32 g of 1,4-dihydropyridine-2,6-dimethyl-3,5-dicarboxylic acid ethyl ester
7 g of tetraoxyethylene lauryl ether
30 g of 2,2'-bis-(o-chlorophenyl)-4,4'5,5'tetraphenyl bisimidazole
2 g of Michler's ketone in 500 ml methyl ethyl ketone
and the other in solution B:
5.5 g of dimethyl ester of 2,6-dimethyl-4-(2'-nitrophenyl)-1,4-dihydropyridine-3,5-dicarboxylic acid
9.5 g of diethyl ester of 2,6-dimethyl-4-(2'-nitrophenyl)-1,4-dihydropyridine-3,5-dicarboxylic acid in 100 ml methyl ethyl ketone The plates are dried for 20 min. at room temperature. The layer thickness of the dried layer is 1.5 μm. Samples A and B are simultaneously exposed for 30 seconds using a mercury vapor lamp (radiation intensity 10 mW/cm$^2$ at 360 nm) through a step wedge ($\sqrt[4]{2}$) and are toned with a black iron oxide pigment. The excess toner is blown off using an air stream.

After 30 min the parts of samples A and B unexposed until now are again exposed and toned under the same conditions. The relative sensitivity expressed as the number of wedge steps with a maximum coating with toner is indicated in Table 1.

TABLE 1

|  | Steps with maximum coating | |
| --- | --- | --- |
|  | A | B |
| 1st exposure | 5 | 5 |
| 2nd exposure | 2 | 5 |

The sensitivity drop with sample A in the second exposure is a result of the evaporation of the plasticizer as well as the partial adsorption of the plasticizer on the toner material of the first toning step.

EXAMPLE 6

7.5 g of dimethyl ester of 2,6-dimethyl-4-(2'-nitrophenyl)-1,4-dihydropyridine-3,5-dicarboxylic acid and 7.5 g of diethyl ester of 2,6-dimethyl-4-(2'-nitrophenyl)-1,4-dihydropyridine-3,5-dicarboxylic acid are dissolved in 200 ml methyl ethyl ketone, are applied onto a glass plate, and are dried. The thickness of the dried layer is 2 μm. The plate is then exposed behind a line original for 70 seconds using a mercury vapor lamp (1000 W) at a distance of 40 cm. Subsequently the plate is agitated in a sealed container with 50 g of a green emitting ZnS phosphor powder and the excess toner is removed by blowing off with air. A toned negative image of the original is obtained.

EXAMPLE 7

An aluminum plate is coated by spraying with a solution of 1.0 g of 2-methyl-4-(2'-nitrophenyl)-1,4,5,6,7,8-hexahydro-5-oxoquinoline-3-carboxylic acid ethyl ester in a mixture of 8 ml ethyl alcohol and 22 ml methyl ethyl ketone. The layer thickness after drying is 1.5 μm.

Exposure is through a step wedge ($\sqrt[3]{2}$) using ultraviolet light (360 nm, 1000 mJ/cm$^2$). Subsequently, powdery titanium dioxide is applied by agitation and the excess is blown off. Four wedge steps with a maximum coating by titanium dioxide are noted.

A second analogous exposure and toning on the same plate yields a second image with likewise 4 wedge steps of maximum covering.

EXAMPLE 8

Two glass plates are coated with a solution of 5.5 g of dimethyl ester of 2,6-dimethyl-4-(2'-nitrophenyl)-1,4-dihydropyridine-3,5-dicarboxylic acid and 9.5 g of diethyl ester of 2,6-dimethyl-4-(2'-nitrophenyl)-1,4-dihydropyridine-3,5-dicarboxylic acid in 100 ml of methyl ethyl ketone and are dried. The layer thickness is 1.5 μm. The two glass plates are exposed through a $\sqrt[3]{2}$ step wedge using an ultraviolet light source (intensity 10 mW/cm$^2$ at 360 nm) for 60 seconds and subsequently are toned with powder of a red emitting phosphor. The relative room humidity for the first plate was 30% and for the second plate 75%. The number of toned wedge steps in both instances was equal to 8.

What is claimed is:

1. Process for the production of patterns on a substrate bearing a layer of a negative-working, light-sensitive composition comprising at least one 1,4-dihydropyridine compound substituted in the 4 position by a 2'-nitrophenyl ring which becomes tacky and tonable on exposure to actinic radiation, comprising the steps of:
   (a) exposing said light-sensitive layer imagewise to actinic radiation whereby tacky areas are formed, and,
   (b) toning said exposed tacky areas with finely divided powders.

2. Process as recited in claim 1, wherein said exposing and toning steps are repeated several times, using different images for exposure and different powders for toning.

3. Process according to claim 1, wherein the light-sensitive layer contains at least one 1,4-dihydropyridine compound of the following formula:

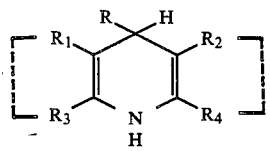

in which:
R is 2'-nitrophenyl, wherein the phenyl radical can be further substituted by alkyl or oxalkyl of 1 to 4 carbon atoms, —OH, halogen, —NH$_2$ groups;

R$_1$ and R$_2$, which can be the same or different, are —CN, —COOR', or —COR', wherein R' represents an alkyl group with 1-11 carbon atoms, which also can be substituted by —OCH$_3$ or —OC$_2$H$_5$;

R$_3$ and R$_4$, which can be the same or different, are alkyl of 1 to 4 carbon atoms;

R$_1$ and R$_3$ taken together may form a 5- and/or or 6-membered carbocyclic or R$_2$ and R$_4$ heterocyclic ring containing a carbonyl group.

4. Process according to claim 1, wherein the light-sensitive composition contains at least one 1,4-dihydropyridine compound chosen from the group consisting of the dimethyl ester, the diethyl ester, and the diisopropyl ester of 2,6-dimethyl-4-(2'-nitrophenyl)-1,4-dihydropyridine-3,5-dicarboxylic acid.

5. Process according to claim 1, wherein said 1,4-dihydropyridine compound is present in a noncrystalline state in said light-sensitive layer.

6. Process according to claim 2, wherein said 1,4-dihydropyridine compound is present in a noncrystalline state in said light-sensitive layer.

7. Process according to claim 3, wherein said 1,4-dihydropyridine compound is present in a noncrystalline state in said light-sensitive layer.

8. Process according to claim 4, wherein said 1,4-dihydropyridine compound is present in a noncrystalline state in said light-sensitive layer.

* * * * *